(12) United States Patent
Maynard et al.

(10) Patent No.: US 9,287,842 B2
(45) Date of Patent: Mar. 15, 2016

(54) METHOD FOR DIGITALLY COMPENSATING VARIATIONS, AS A FUNCTION OF TEMPERATURE, OF AN ELECTRICAL QUANTITY OF AN EMBEDDED SPACE RADIOFREQUENCY TELECOMMUNICATIONS EQUIPMENT ITEM

(71) Applicant: THALES, Courbevoie (FR)

(72) Inventors: Jean Maynard, Ramonville (FR); Raoul Rodriguez, Bruguieres (FR); Grégory Mouchon, Toulouse (FR); Philippe Chubbert, Toulouse (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/803,050

(22) Filed: Jul. 18, 2015

(65) Prior Publication Data
US 2016/0020742 A1    Jan. 21, 2016

(30) Foreign Application Priority Data

Jul. 18, 2014    (FR) ..................................... 14 01615

(51) Int. Cl.
| | |
|---|---|
| *H03G 3/30* | (2006.01) |
| *H04B 1/16* | (2006.01) |
| *H03G 3/00* | (2006.01) |
| *H03K 5/01* | (2006.01) |
| *H03K 5/00* | (2006.01) |

(52) U.S. Cl.
CPC ............ *H03G 3/3036* (2013.01); *H03G 3/002* (2013.01); *H03K 5/01* (2013.01); *H04B 1/1607* (2013.01); *H03K 2005/00286* (2013.01)

(58) Field of Classification Search
CPC ... G01S 19/235; H03F 1/32; H03F 2200/468; H03L 1/025; H03L 1/026; H04B 17/21; H04B 1/1607; H03G 3/3036; H03G 3/002; H03K 5/01; H03K 2005/00286
See application file for complete search history.

(56) References Cited

U.S. PATENT DOCUMENTS

| | | | |
|---|---|---|---|
| 6,553,084 | B1 | 4/2003 | Maru |
| 2004/0213355 | A1 | 10/2004 | Morton et al. |
| 2005/0221764 | A1 | 10/2005 | Shen et al. |
| 2006/0267703 | A1 | 11/2006 | Wang et al. |
| 2008/0278236 | A1* | 11/2008 | Seymour ............... H03F 1/0211 330/279 |
| 2013/0106476 | A1* | 5/2013 | Joubert ..................... H03L 1/00 327/156 |

FOREIGN PATENT DOCUMENTS

WO    2012/114836 A1    8/2012

* cited by examiner

*Primary Examiner* — Vineeta Panwalkar
(74) *Attorney, Agent, or Firm* — Baker & Hostetler LLP

(57) ABSTRACT

A digital compensation method includes measuring the temperature of the equipment item and applying an analogue control voltage intended to maintain the electrical quantity of the equipment item at a predetermined setpoint value. At each measurement instant, the method includes interrogating look-up tables respectively associated with different setpoint values, then, when the measured temperature is situated between two digital temperature states stored in the look-up tables, creating intermediate digital temperature states situated between the two stored digital temperature states, computing, by interpolation, digital control words corresponding to the intermediate digital temperature states created, and selecting a digital control word, stored or intermediate, corresponding to the measured temperature, then delivering, to at least one of the N individual devices, the analogue control corresponding to the selected digital control word.

4 Claims, 10 Drawing Sheets

| Measured temperature (°C) | Digitized binary temperature states | Stored control word (decimal) | DAC output voltage ($V_c$) |
|---|---|---|---|
| -10 | 000 | 7 | 4.00 |
| 0 | 001 | 5 | 2.86 |
| 10 | 010 | 4 | 2.29 |
| 20 | 011 | 3 | 1.71 |
| 30 | 100 | 2 | 1.14 |
| 40 | 101 | 2 | 1.14 |
| 50 | 110 | 2 | 1.14 |
| 60 | 111 | 2 | 1.14 |

| Measured temperature (°C) | Digitized temperature states (binary) | Digitized temperature states (decimal) | Stored control word (decimal) | Computed control word (decimal) | Applied control word (decimal) | DAC output voltage (Vc) |
|---|---|---|---|---|---|---|
| -10 | 00000 | 0 | 7 | / | 7 | 4.00 |
| -7.5 | 00001 | 1 | | 6 | 6 | 3.43 |
| -5 | 00010 | 2 | | 6 | 6 | 3.43 |
| -2.5 | 00011 | 3 | | 5 | 5 | 2.86 |
| 0 | 00100 | 4 | 5 | / | 5 | 2.86 |
| 2.5 | 00101 | 5 | | 4 | 4 | 2.29 |
| 5 | 00110 | 6 | | 4 | 4 | 2.29 |
| 7.5 | 00111 | 7 | | 4 | 4 | 2.29 |
| 10 | 01000 | 8 | 4 | / | 4 | 2.29 |
| 12.5 | 01001 | 9 | | 3 | 3 | 1.71 |
| 15 | 01010 | 10 | | 3 | 3 | 1.71 |
| 17.5 | 01011 | 11 | | 3 | 3 | 1.71 |
| 20 | 01100 | 12 | 3 | / | 3 | 1.71 |
| 22.5 | 01101 | 13 | | 2 | 2 | 1.14 |
| 25 | 01110 | 14 | | 2 | 2 | 1.14 |
| 27.5 | 01111 | 15 | | 2 | 2 | 1.14 |
| 30 | 10000 | 16 | 2 | / | 2 | 1.14 |
| 32.5 | 10001 | 17 | | 2 | 2 | 1.14 |
| 35 | 10010 | 18 | | 2 | 2 | 1.14 |
| 37.5 | 10011 | 19 | | 2 | 2 | 1.14 |
| 40 | 10100 | 20 | 2 | / | 2 | 1.14 |
| 42.5 | 10101 | 21 | | 2 | 2 | 1.14 |
| 45 | 10110 | 22 | | 2 | 2 | 1.14 |
| 47.5 | 10111 | 23 | | 2 | 2 | 1.14 |
| 50 | 11000 | 24 | 2 | / | 2 | 1.14 |
| 52.5 | 11001 | 25 | | 2 | 2 | 1.14 |
| 55 | 11010 | 26 | | 2 | 2 | 1.14 |
| 57.5 | 11011 | 27 | | 2 | 2 | 1.14 |
| 60 | 11100 | 28 | 2 | / | 2 | 1.14 |
| 62.5 | 11101 | 29 | | | | |
| 65 | 11110 | 30 | | | | |
| 67.5 | 11111 | 31 | | | | |

FIG.4b

| Measured temperature (°C) | Digitized temperature states (binary) | Digitized temperature states (decimal) | Stored control word (decimal, i bits) | Control word computed (decimal j bits) and applied to DAC input | DAC output voltage (Vc) |
|---|---|---|---|---|---|
| -10 | 00000 | 0 | 7 | 28 | 4.00 |
| -7.5 | 00001 | 1 | | 26 | 3.71 |
| -5 | 00010 | 2 | | 24 | 3.43 |
| -2.5 | 00011 | 3 | | 22 | 3.14 |
| 0 | 01100 | 4 | 5 | 20 | 2.86 |
| 2.5 | 01001 | 5 | | 19 | 2.71 |
| 5 | 01010 | 6 | | 18 | 2.57 |
| 7.5 | 01011 | 7 | | 17 | 2.43 |
| 10 | 01000 | 8 | 4 | 16 | 2.29 |
| 12.5 | 01001 | 9 | | 15 | 2.14 |
| 15 | 01010 | 10 | | 14 | 2.00 |
| 17.5 | 01011 | 11 | | 13 | 1.86 |
| 20 | 01100 | 12 | 3 | 12 | 1.71 |
| 22.5 | 01101 | 13 | | 11 | 1.57 |
| 25 | 01110 | 14 | | 10 | 1.43 |
| 27.5 | 01111 | 15 | | 9 | 1.29 |
| 30 | 10000 | 16 | 2 | 8 | 1.14 |
| 32.5 | 10001 | 17 | | 8 | 1.14 |
| 35 | 10010 | 18 | | 8 | 1.14 |
| 37.5 | 10011 | 19 | | 8 | 1.14 |
| 40 | 10100 | 20 | 2 | 8 | 1.14 |
| 42.5 | 10101 | 21 | | 8 | 1.14 |
| 45 | 10110 | 22 | | 8 | 1.14 |
| 47.5 | 10111 | 23 | | 8 | 1.14 |
| 50 | 11000 | 24 | 2 | 8 | 1.14 |
| 52.5 | 11001 | 25 | | 8 | 1.14 |
| 55 | 11010 | 26 | | 8 | 1.14 |
| 57.5 | 11011 | 27 | | 8 | 1.14 |
| 60 | 11100 | 28 | 2 | 8 | 1.14 |
| 62.5 | 11101 | 29 | | 8 | 1.14 |
| 65 | 11110 | 30 | | 8 | 1.14 |
| 67.5 | 11111 | 31 | | 8 | 1.14 |

FIG.6a

METHOD FOR DIGITALLY COMPENSATING VARIATIONS, AS A FUNCTION OF TEMPERATURE, OF AN ELECTRICAL QUANTITY OF AN EMBEDDED SPACE RADIOFREQUENCY TELECOMMUNICATIONS EQUIPMENT ITEM

CROSS-REFERENCE TO RELATED APPLICATION

This application claims priority to foreign French patent application No. FR 1401615, filed on Jul. 18, 2014, the disclosure of which is incorporated by reference in its entirety.

FIELD OF THE INVENTION

The present invention relates to a method for digitally compensating variations, as a function of temperature, of an electrical quantity of an embedded space radiofrequency telecommunications equipment item. It applies to any telecommunications equipment item using a digital control and for which an electrical quantity varies as a function of temperature. The electrical quantity which varies can be of any type, for example a gain, or a voltage, or a phase, or a power, or a frequency, or of another type. The digital control can be of all types, for example a fixed gain control voltage or a phase or power or frequency control, or a predistortion linearization device control voltage, or of other type. In particular, it applies to the field of space applications, to the electronic radiofrequency telecommunications equipment items that use digital controls such as the equipment items incorporated in radiofrequency chains on board telecommunications satellites, such as, for example, the low-noise amplifiers, the preamplifiers, the solid-state power amplifiers, the gain attenuators or the frequency convertors, the phase shifters.

BACKGROUND

For a good understanding of the invention, the rest of the description relates to the precise example of an equipment item for which the electrical quantity which varies as a function of temperature is the gain or the phase of the equipment item and where the digital control is a control voltage but it is obvious that the invention is not limited to this electrical quantity and to this type of control.

As represented in the example of FIG. 1, the compensation of the variations of an electrical quantity of a radiofrequency equipment item 10 as a function of temperature, for example the variations of the gain or of the phase of a radiofrequency chain comprising, linked in series, amplifiers 11 and attenuators 12 that can be controlled, for example in voltage, is conventionally produced from a single analogue control Vc applied at the input of the equipment item. For this, from a setpoint, for example a gain setpoint, imposed by a user, a control device 16 generates an analogue control 17 which is applied to the equipment item 10 via an electronic circuit based on resistors and thermistors 18, the thermistors ensuring the temperature compensation of the equipment item. The compensation of the variations, for example of the gain, of an equipment item by analogue control therefore entails adding wiring for resistors and thermistors directly to the equipment item 10, which increases the weight, the bulk and the cost of the equipment item. Furthermore, the value of these components has to be optimized finely and requires the use of expensive methods involving temperature cycles to determine the values of the components, check the performance levels and repeat these temperature cycles and these checks until the objective concerning the desired performance levels, such as the temperature gain stability for example, is reached.

The compensation of the variations of the gain, or of the phase, or of any other electrical parameter or quantity, of a radiofrequency equipment item 10 can also be performed from a digital control, which makes it possible to improve the competitiveness of the equipment item by virtue of the cost and weight reductions which result therefrom and to reduce the equipment item setting time. However, contrary to an analogue control which corresponds to the application of a continuous value, for example voltage value, at the input of the equipment item and to a continuous variation of the electrical quantity of the equipment item, for example of the gain or of the phase of the equipment item, a digital control consists of a succession of discontinuous digital states, called digital control words, stored in look-up tables at different addresses of a memory. Each stored digital control word corresponds to a digital control value to be applied to the equipment item for a gain setpoint value imposed by the user and for a temperature value measured on the equipment item. However, on each change of state, these discontinuous states induce, on the curve of variation of the electrical quantity, for example of the gain, of the equipment item, transient spurious fluctuations in amplitude and also in phase, as well as other possible secondary effects as a function of the nature of the physical quantities controlled, which can be very rapid and which, if they are not controlled, can disturb the telecommunications traffic bit rate and quality and induce a risk of desynchronization of the telecommunications receivers in the communication chain including the equipment item. To resolve these problems, it is conventional practice to increase the number of states stored in the memory and the associated memory space. However, this solution is limited by the capacity of the memory available, entails the use of analogue/digital convertors operating on a number of digital bits that is all the higher as the number of states increases, which does not make it possible to address the absence of traffic interruption in case of a change of the value of the electrical quantity, for example of the gain or of the phase, by remote control.

SUMMARY OF THE INVENTION

The aim of the invention is to remedy the drawbacks of the known control methods and to produce a method for digitally compensating variations, as a function of temperature, of an electrical quantity of an embedded space radiofrequency telecommunications equipment item, which does not entail increasing the capacity of the memory, makes it possible to limit the impact of the transient spurious fluctuations, which does not affect the data transmission performance levels such as the bit rate, the quality of the traffic and which does not induce any risk of desynchronization of the telecommunications receivers even in the case of modification of the setpoint value of the electrical quantity.

For that, the invention relates to a method for digitally compensating variations, as a function of temperature, of an electrical quantity of an embedded space radiofrequency telecommunications equipment item, the equipment item comprising N individual devices, where N is greater than or equal to one, the electrical quantity of the equipment item having to be maintained at a predetermined setpoint value, the method consisting, in order:

in measuring the temperature of the equipment item at different measurement instants, at each measurement instant, in interrogating look-up tables, respectively dedicated to different setpoint values, in which digital control words are stored that are to be applied to the equipment item as a function of different digital temperature states corresponding to different measured temperature values, when the measured temperature is situated between two digital temperature states stored in the look-up tables, in creating intermediate digital temperature states situated between the two stored digital temperature states and in computing, by interpolation, digital control words corresponding to the intermediate digital temperature states created, furthermore, between two stored digital control words, in creating, by interpolation, intermediate digital control words coded on a number of bits greater than the number of bits of the stored digital control words, in selecting a digital control word corresponding to the measured temperature then in delivering, to the equipment item, an analogue control corresponding to the selected digital control word.

Advantageously, according to one embodiment, when N is greater than one, on each change of digital temperature state, the analogue control corresponding to the selected digital control word is delivered to just one of the N individual devices of the equipment item, the N individual devices being chosen sequentially in turn on each change of digital temperature state.

Alternatively, according to another embodiment, on each change of digital temperature state, the analogue control corresponding to the selected digital control word is divided up into N individual analogue controls respectively delivered to the N individual devices of the equipment item, the N individual analogue controls being staggered in time relative to one another.

Advantageously, the method can further consist in applying a linear temporal filtering to the analogue control voltage.

BRIEF DESCRIPTION OF THE DRAWINGS

Other particular features and advantages of the invention will become clearly apparent hereinafter in the description given by way of purely illustrative and nonlimiting example, with reference to the attached schematic drawings which represent:

FIG. 4b: a table illustrating an example of digital compensation of the variations of an electrical quantity consisting, from the look-up tables, in creating intermediate temperature states in order to reduce the amplitude and the phase of the fluctuations of an electrical quantity of an equipment item, according to an embodiment of the invention;

FIG. 5b: a diagram illustrating a first example of application of the digital controls to the equipment item, according to the embodiment of FIG. 5a;

FIG. 5c: a diagram illustrating a second example of application of the digital controls to the equipment item, according to the embodiment of FIG. 5a;

FIG. 6a: a table illustrating another example of digital compensation of the variations of an electrical quantity consisting, from the look-up tables, in creating intermediate control words in order to reduce the amplitude and the phase of the fluctuations of an electrical quantity of an equipment item, according to another embodiment of the invention;

FIG. 6b: an example of a curve of variation of the gain of a digitally temperature-compensated equipment item, according to the example of compensation of FIG. 6a;

FIG. 6c: an example of a curve illustrating analogue control voltages for the different digitized temperature states of FIG. 6a;

FIG. 7b: an example of a curve of trend of a control voltage after filtering during a change of digital control state, according to the embodiment of FIG. 7a.

DETAILED DESCRIPTION

Figure 1:
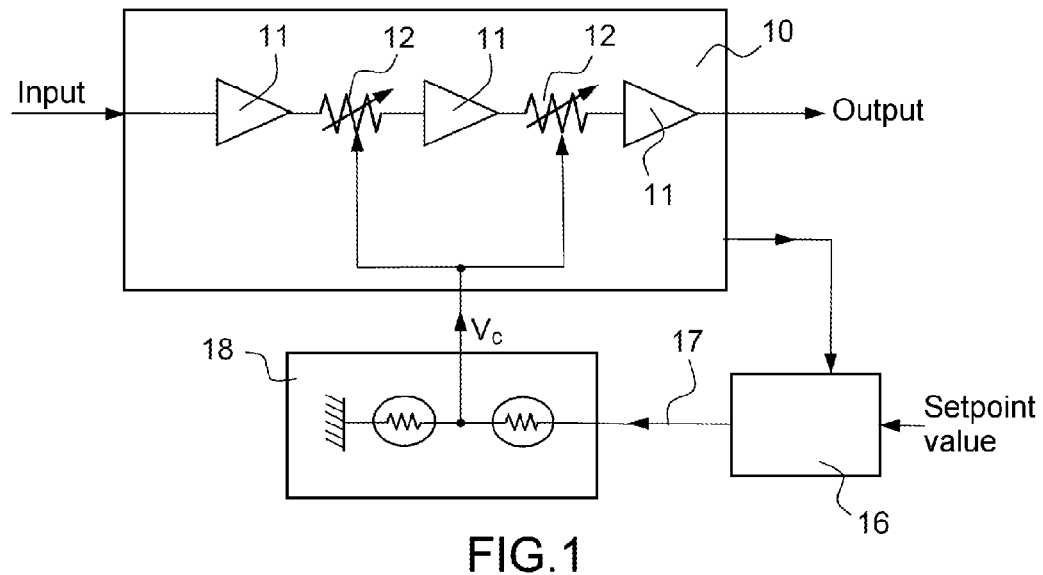
FIG. 1: a block diagram of an example of an analogue device for compensating variations of an electrical quantity, for example of the gain, of a radiofrequency telecommunications equipment item as a function of temperature, according to the prior art.
Figure 2:
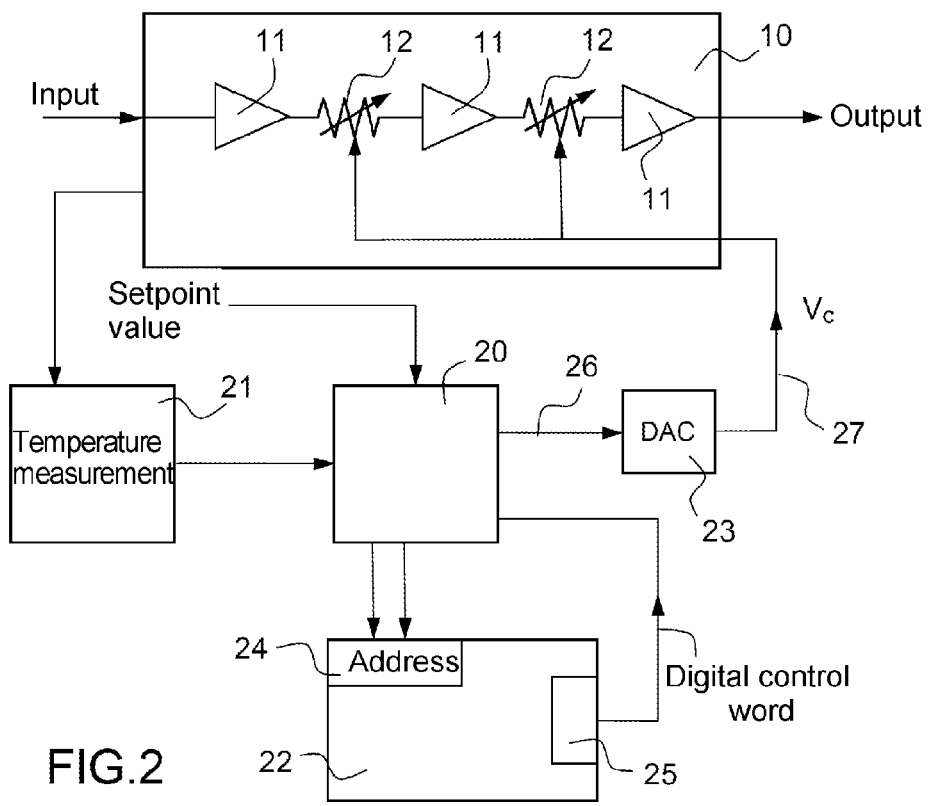
FIG. 2: a block diagram of an example of a digital device for compensating variations of an electrical quantity, for example of the gain of a radiofrequency telecommunications equipment item as a function of temperature, according to the prior art.

The device for digitally compensating variations of an electrical quantity, for example of the gain or of the phase, of a radiofrequency telecommunications equipment item as a function of temperature represented in FIG. 2 comprises an equipment item 10 of which an electrical quantity varies as a function of temperature, a digital measurement device 21 for measuring the temperature of the equipment item, a digital control device 20 for the equipment item linked to a programmable memory 22 and a digital/analogue convertor DAC 23 suitable for converting the digital control delivered by the digital control device 20 into an analogue control Vc applied to the equipment item 10. In this example, the temperature-variable electrical quantity is the gain of the equipment item and the control is a voltage, but the invention is not limited to these physical quantities. The programmable memory 22 can for example be chosen from the memories of PROM (Programmable Read Only Memory) or EPROM (Erasable Read Only Memory) or EEPROM (Electrically Erasable Read Only Memory) type, or can be a memory associated with or incorporated in an ASIC (Application Specific Integrated Circuit), a microcontroller or a programmable logic circuit, or a programmable logic array, for example an FPGA (Field-Programmable Gate Array). The telecommunications equipment item 10 can comprise one or more individual devices 11, 12 arranged in series and each individual device 11, 12 can comprise an electrical quantity, for example a gain, which varies with temperature. The digital control device 20 comprises an input intended to receive a setpoint value imposed by a user and an input connected to the temperature measurement device 21. The setpoint value depends on the electrical quantity which varies with temperature and can, for example, be a gain setpoint value if the electrical quantity which varies with temperature is the gain. The memory 22 contains look-up tables giving, for a setpoint value imposed by a user, digital control words corresponding to different temperature values. The digital control words are stored at different addresses of the memory 22, each address depending on the temperature and on the setpoint value. Upon reception of each temperature measurement transmitted by the measurement device 21, the digital control device 20 interrogates an address 24 of the memory 22 corresponding to the measured temperature and to the setpoint value and the memory 22 communicates to it in return the digital control word 25 stored at this address. On reception of the digital control word, the digital control device 20 transmits it to the digital/analogue convertor 23 which converts the digital control word into an analogue control 27, for example a control voltage Vc, which is applied to a control input of the equipment item 10. If the equipment item 10 comprises a number of identical individual devices 12 for which an electrical quantity, for example the gain, has to be regulated as a function of temperature, for example a plurality of attenuators and/or a plurality of amplifiers linked in series, the analogue control 27 applied to the control input of the equipment item 10 is then applied simultaneously in parallel to the respective control input of each of these individual devices for which the electrical quantity has to be regulated.

Figures 3A, 3B:
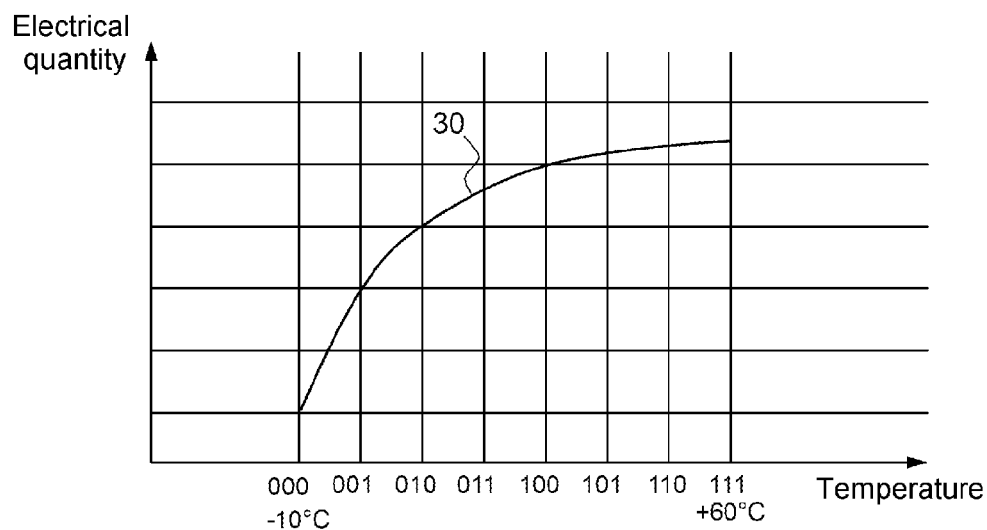
FIG. 3a: a diagram of an example of a curve of natural variation of an electrical quantity of an equipment item as a function of temperature, in the absence of any compensation, according to the prior art.
FIG. 3b: a diagram of an example of a look-up table, for a given gain setpoint, stored in a memory, according to the prior art.

By way of nonlimiting example, FIG. 3a illustrates an example of a curve 30 of natural variation of an electrical quantity, for example the gain, of an equipment item as a function of temperature, the variations not being compensated. To compensate the variations of the electrical quantity as a function of temperature, a desired setpoint value is chosen by the user. Temperature measurements are regularly performed on the equipment item and transmitted to the digital control device 20 which searches in the memory 22 for the look-up table which corresponds to the chosen setpoint value. FIG. 3b shows an example of a look-up table which can be stored in the memory 22 for a given setpoint value. In this example, the setpoint value is a gain value G, the temperature values stored in the look-up table are indicated in degrees centigrade in the first column, the digitized temperature states coded in binary on i bits, where i is equal to three in this example, are indicated in the second column, the stored digital control words corresponding to the different temperature values are indicated as decimal values in the third column. In the fourth column, values in volts are stored for the output voltages of the digital/analogue convertor DAC 23 corresponding to the different stored control words. The memory 22 can comprise a large number of different look-up tables respectively dedicated to different gain setpoint values. The different look-up tables comprise different stored digital states, each digital state associating, for a gain setpoint value G imposed by a user, and for a temperature value of the equipment item, a digital control word corresponding to an analogue control voltage to be applied to the equipment item to compensate the effect of the temperature on the overall variation of the gain of the equipment item. The accuracy of the temperature compensation depends on the number of different states digitized and stored in the memory. When the measured temperature lies between two consecutive states digitized and stored in the memory, the state corresponding to the measured temperature not being stored in the look-up table, the selected control word corresponds, depending on the choice, to the stored temperature state immediately lower or immediately higher than this measured temperature. For a given gain setpoint, the temperature-compensation of the gain is then incomplete and the gain varies as a function of temperature according to a sawtooth form curve 31 as represented for example in FIG. 3c where the different successive temperatures are represented on the x axis and the gain on the y axis. For example, for a temperature variation of between −10° and +60°, a gain setpoint of G equal to 10 dB and a look-up table comprising 8 different stored temperature states, the 8 different states corresponding to temperatures spaced apart by 10°, the control word 000 can correspond to the temperature −10°, the control word 001 to the temperature 0°, the control word 010 to the temperature +10°, . . . , the control word 111 to the temperature +60°. Between two consecutive states stored in the look-up table, for example between 0° and +10°, the gain compensation control remains constant and equal to that corresponding to 0°. Between two consecutive stored states, the gain is not then fully compensated but follows a natural variation curve 30, increasing in this example, when the temperature increases. The curve 31 corresponds to a digital control that is constant between two consecutive states stored in the look-up table. Each time the temperature reaches a value corresponding to a state stored in the look-up table, for example 001, or 010, or 100, the temperature compensation can be produced exactly by virtue of the digital control word stored in the look-up table at this address and in accordance with the gain setpoint. Thus, each time the temperature corresponds to a stored state, the gain takes the value corresponding to the gain setpoint, for example 10 dB (decibels). Each change of digital temperature state stored, called transition, therefore corresponds to an abrupt variation of amplitude of the gain of the equipment item corresponding to the amplitude of a transient signal. For example, in FIG. 3c, the transition from the stored digital temperature state 000 to the state 001 corresponds to a variation of amplitude of value A.

Figure 3C:
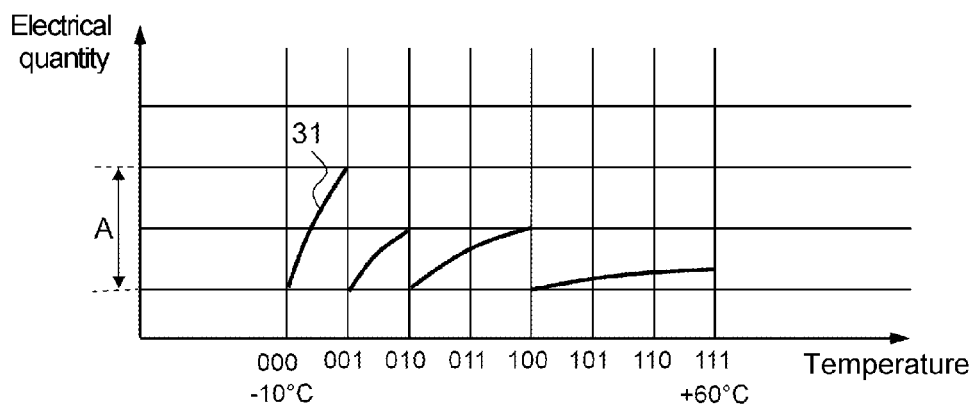
FIG. 3c: an example of a curve of variation of the gain of a digitally temperature-compensated equipment item, according to the prior art.
Figure 3D:
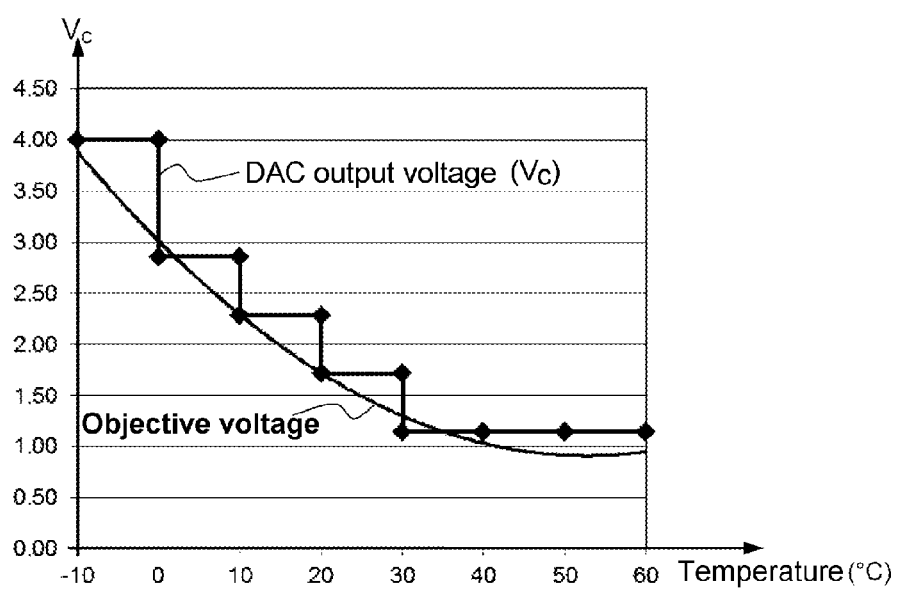
FIG. 3d: an example of a curve of variation of the control voltage of the equipment item of FIG. 2, according to the prior art.

FIG. 3d illustrates an example of a curve of variation of the control voltage of the equipment item delivered by the DAC 23 of FIG. 2.

In the field of telecommunications, it is particularly important to reduce the amplitude of variation of the gain or of the phase of the embedded space radiofrequency telecommunications equipment item on each change of digital state in order to limit the appearance of the rapid transient fluctuations which generate abrupt variations of the gain and of the phase of the telecommunications signals, which disturb the data traffic and which can cause the digital demodulators of the data transmission chains to become desynchronized.

Figure 4A:
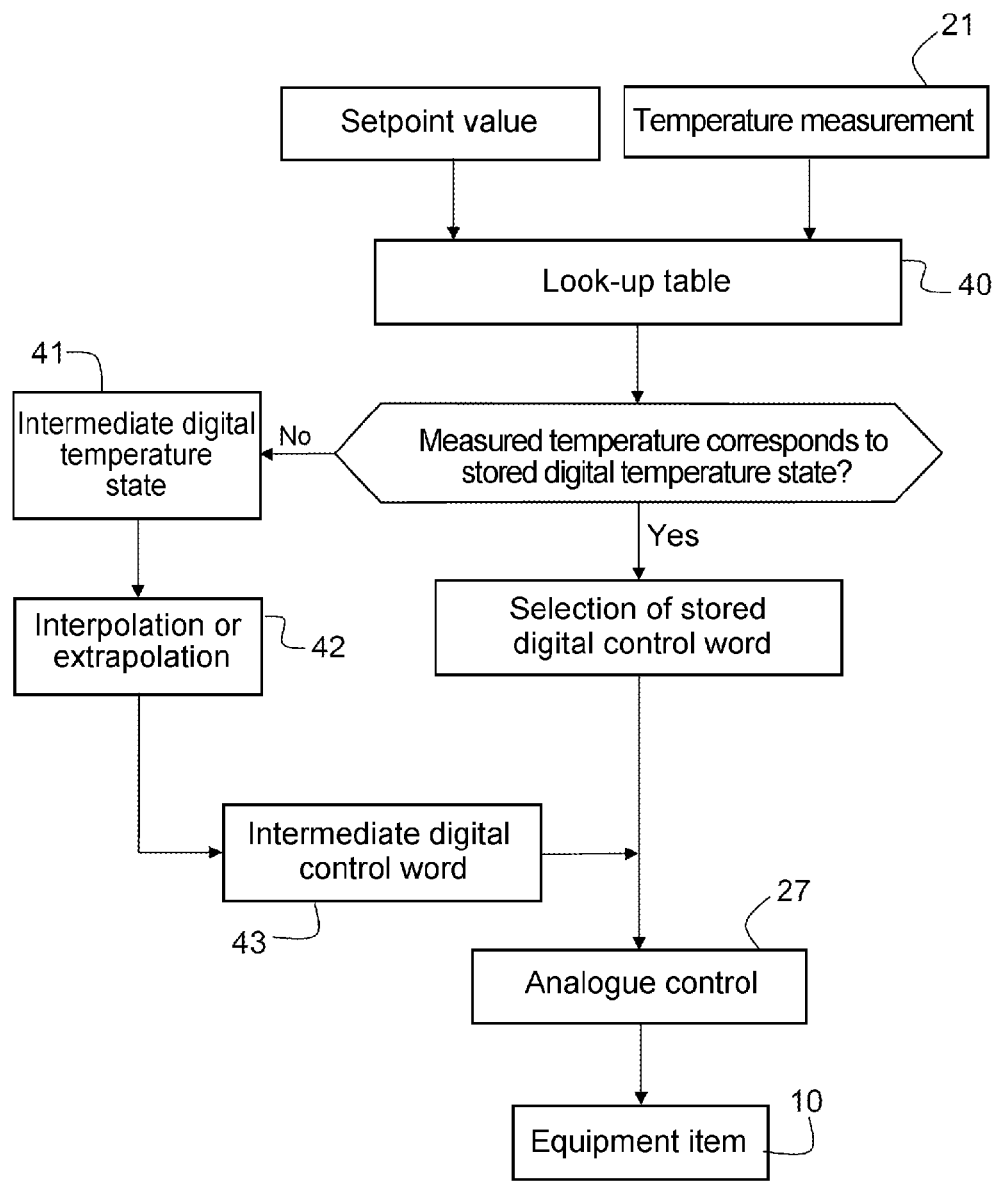
FIG. 4a: a block diagram illustrating the main steps of an embodiment of the compensation method, according to the invention.

The rest of the description relates to the case where the telecommunications equipment item 10, incorporated in a data transmission chain, comprises N individual devices 12a, 12b, . . . , 12c of which an electrical quantity, for example the gain or the phase, can be controlled as a function of temperature to compensate the performance variations of all of the data transmission chain. The N individual devices 12a, 12b, . . . , 12c can be connected in series or in parallel. As illustrated in the block diagram of FIG. 4a, to reduce the amplitude of variation of the electrical quantity, for example the gain or the phase, of the telecommunications equipment item 10, on each change of digital temperature state, without increasing the number of bits used for the binary coding of the control words, the invention consists, between the different digital temperature states stored in the look-up tables of the memory 22, in creating 41, in the digital control device 20, additional intermediate digital temperature states corresponding to measured temperatures having values lying within the range of variation of the stored temperatures, and, if appropriate, additional intermediate digital temperature states corresponding to measured temperatures 21 having values situated beyond the range of variation of the stored temperatures, then in computing 42 by interpolation, or respectively by extrapolation, additional digital control words 43 corresponding to the intermediate digital temperature states created. Each additional digital control word is computed, by interpolation or by extrapolation, from at least two digital states stored in a look-up table 40 of the memory 22, the two stored digital states being able to be consecutive, that is to say correspond to two temperature values immediately above and immediately below the measured temperature, or nonconsecutive. Any type of interpolation or of extrapolation can be used, for example linear or of more complex type. Thus, from the example of a look-up table of FIG. 3b, in which the number of binary coding bits i for each digital temperature state is equal to three, it is possible to create additional digital temperature states by using, for each digital temperature state, a number of binary coding bits j greater than i, therefore greater than three in this example. For example, if the value of j is chosen to be equal to five as represented in FIG. 4b, the temperature states digitized on three bits and stored in the memory 22 are modified to temperature states digitized on five bits, which makes it possible to add, between two consecutive states, k and k−1, of temperature $T_k$ and $T_{k+1}$, three computed intermediate digital temperature states and therefore to multiply by four the number of states available compared to the number of temperature states stored in the memory 22. In particular, in the example of FIG. 4b, for a measured temperature of between $T_k=-10°$ and $T_{k+1}=0°$ and corresponding respectively to the two stored digital temperature states 00000 and 00100, the digital control device 20 computes, by interpolation/extrapolation, additional intermediate control words which are applied for intermediate temperature states Tint corresponding to the digital states 00001, 00010, 00011. In this example, an interpolation makes it possible to compute intermediate control words Mc(Tint) for all the intermediate temperature states Tint lying between two consecutive temperature states $T_k$ and $T_{k+1}$ stored in the memory 22. For example, in the case where the interpolation is of linear type, the computed intermediate control word Mc(Tint), in decimal value, corresponding to the intermediate temperature state Tint, digitized in decimal value, can be computed by the equation below:

$$Mc(Tint)=Mc(T_k)+[Mc(T_{k+1})-Mc(T_k)]*[(Tint-T_k)/[T_{k+1}-T_k]]$$

Thus, for example, when Tint is the intermediate temperature state corresponding to the digital word 00001, the corresponding computed control word $Mc(00001)=7+[5-7]\times[1-0]/[4-0]=6.5$.

Since the digital control word has to be an integer number, according to the invention, only the integer part of the computed control word, equal to 6 in this example, is retained as digital control word interpolated for the intermediate digital temperature corresponding to the binary value 00001.

Figure 4C:
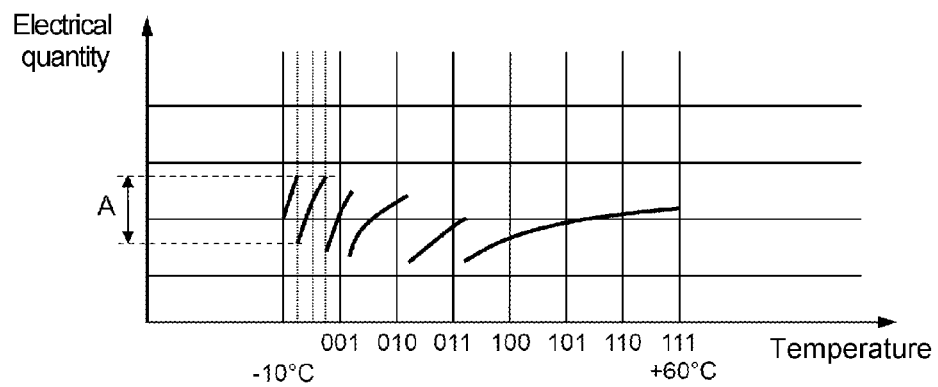
FIG. 4c: an example of a curve of variation of the gain of a digitally temperature-compensated equipment item, according to the example of compensation of FIG. 4b.
Figure 4D:
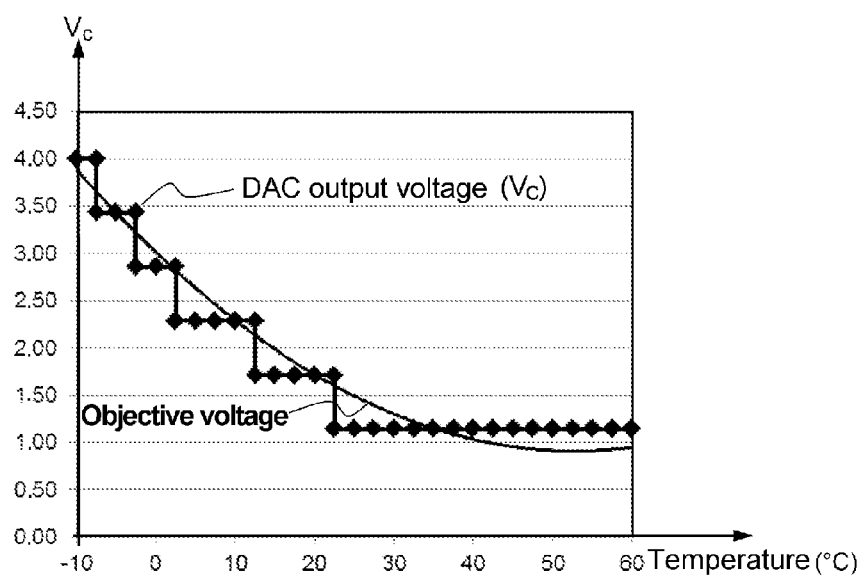
FIG. 4d: an example of a curve illustrating analogue control voltages for the different digitized temperature states of FIG. 4b.

FIG. 4c illustrates an example of a curve of variation of the gain of a telecommunications equipment item obtained after digital temperature compensation, in accordance with this embodiment. The analogue control voltages Vc resulting therefrom at the output of the DAC 23 are represented in FIG. 4d for the different digitized temperature states.

By adding, by linear interpolation, a number of intermediate temperature states between the different stored temperature states, it is thus possible to more finely compensate any electrical quantity of the equipment item, for example the gain or the phase, as a function of temperature, and to considerably reduce the amplitude of variation of this electrical quantity of the equipment item, on each change of digital state, without increasing the memory space as is shown, for example, by the typical curve of gain variation as a function of temperature represented in FIG. 4c. In effect, the gain curve represented in FIG. 4c shows that the transients and the variations A of gain are smaller in this embodiment of the invention than on the gain curve represented in FIG. 3c corresponding to the prior art, whereas the memory space used in these two embodiments is the same.

Figure 5A:
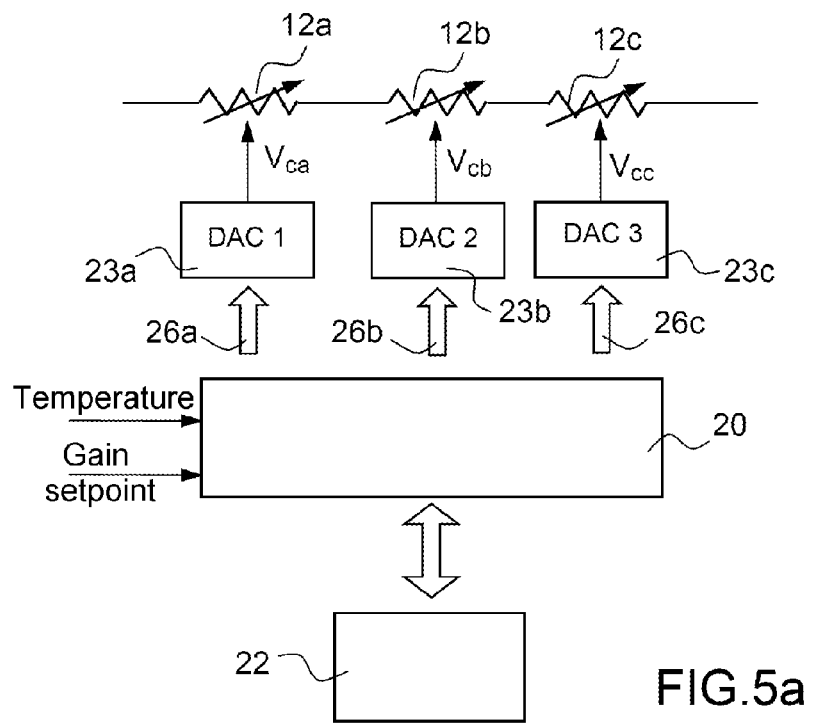
FIG. 5a: a diagram illustrating a first exemplary embodiment of a device for digitally compensating variations of an electrical quantity, making it possible to reduce the amplitude and the phase of the fluctuations of the electrical quantity on each change of digital state, according to an embodiment of the invention.

Together with the creation of intermediate digital temperature states, the invention can comprise an additional step consisting in subdividing any transient fluctuations of the gain or of the phase of the equipment item into a plurality of individual transient signals of lower amplitudes and distributed in time. For this, as represented in FIG. 5a in the case where N is equal to three, instead of applying an overall analogue control 27 at the input of the equipment item 10 to globally regulate the gain or the phase of the equipment item, the invention consists in splitting the overall gain or phase compensation control of the equipment item into N different individual analogue controls Vca, Vcb, ... Vcc, independent of one another, of lower amplitudes and distributed in time, the N individual analogue controls being respectively applied at the input of the N corresponding individual devices 12a, 12b, ..., 12c of the equipment item. The N individual analogue controls are supplied by N different digital/analogue convertors 23a, 23b, 23c respectively connected to N different outputs of the digital control device 20 and are generated from N individual digital controls supplied by the digital control device 20.

The N individual controls can be generated by different methods.

Figure 5B:
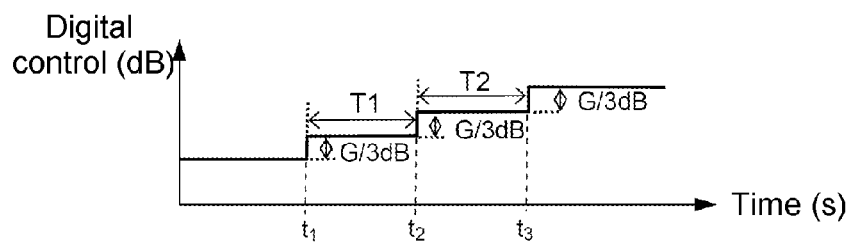

In a first method illustrated in FIG. 5b, on each change of digital temperature state, the analogue control corresponding to the selected digital control word is divided up into N individual analogue controls respectively delivered to the N individual devices, the N individual analogue controls being staggered in time relative to one another. For this, the digital control device 20 interrogates the memory 22 to obtain the digital control word corresponding approximately to a gain setpoint having a value reduced by a factor N relative to the global gain setpoint set by the user. The digital control word that is thus obtained is processed by the digital control device which then delivers N digital controls 26a, 26b, ..., 26c on its N outputs. However, according to the invention, the N individual digital controls are not delivered simultaneously by the digital control device, but sequentially. For this, the N digital controls are delayed relative to one another according to a predefined sequencing so as to divide up in time any transient fluctuations due to each compensation of the gain of an individual device. The N digital/analogue convertors DAC 23a, 23b, 23c then convert the N digital controls delivered on the N outputs of the digital control device into N individual analogue control voltages respectively dedicated to controlling the gain or the phase of the N individual devices of the equipment item, each analogue control voltage having a sensitivity reduced by a factor approximately equal to 1/N relative to the overall analogue voltage to be applied to the equipment item. In the example of FIGS. 5a and 5b, N is equal to 3 and the digital control word obtained from the memory 22 corresponds to a gain setpoint, denoted G/3, associated with each individual device. The three individual digital controls 26a, 26b, 26c, corresponding to the three gain setpoints associated with each individual device, are delivered on the three outputs of the control device 20 at different instants. The first individual digital control is transmitted to the first digital/analogue convertor 23a at the instant $t_1$, then, after a first delay T1, the second individual digital control is transmitted to the second digital/analogue convertor 23b at the instant $t_2$, and finally, after a second delay T2, the third individual digital control is transmitted to the third digital/analogue convertor 23c at the instant $t_3$.

Figure 5C:
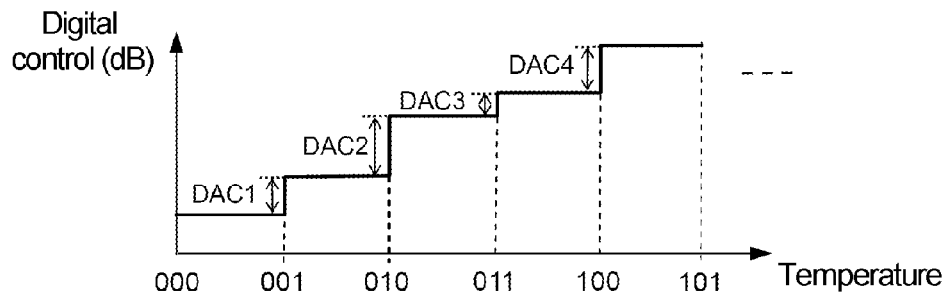

In a second method illustrated in FIG. 5c, on each change of digital temperature state, also called temperature transition, the digital control device 20 generates only a single digital control which is applied to a single digital/analogue convertor DAC to control a single individual device of the equipment item on each change of temperature state, the digital/analogue convertor DAC and the corresponding individual device controlled on each new temperature transition being chosen in succession and cyclically, one after the other. Thus, on each temperature transition, the digital controls 26a, 26b, 26c applied at the input of each digital/analogue convertor DAC1 23a, DAC2 23b and DAC3 23c can be different from one another. For example, when the temperature word changes from the value 000 to 001, only the first DAC sees a digital control modified on its input and the control word dedicated to the DAC1 23a can be modified to compensate the corresponding temperature variations. When the temperature word changes from the value 001 to 010, only the second DAC sees a digital control modified on its input and the control word dedicated to the DAC2 23b can be modified to compensate the temperature variations. When the temperature word changes from the value 010 to 011, only the third DAC sees a digital control modified on its input and the control word dedicated to the DAC 23c can be modified to compensate the temperature variations. Then, once again, only the DAC 23a sees a digital control modified on its input between 011 and 100, and so on, which makes it possible to limit the transient seen by the user on the complete radiofrequency chain. The order of application of the different digital controls is not limited to the example described above and can be modified according to needs. Still according to the same principle of having only a single individual device refreshed for each digital temperature transition, other solutions can be envisaged, notably by using the N individual devices differently. All or some of these individual devices can be used to perform the temperature compensation, all or some of these individual devices can be used to apply the setpoint imposed by the user, a same individual device being able to be used only for the temperature compensation or, on the contrary, only for the setpoint imposed by the user or both for the temperature compensation and the setpoint of the user.

To reduce the amplitude of variation of the gain of an equipment item on each change of digital state without increasing the necessary memory space, jointly with the creation of intermediate digital temperature states, the invention can further consist in providing a number of digital control states 26 at the input of the DAC 23 that is greater than the number of control states stored in the memory 22. In this case, the control device 20 must also create, by computation, intermediate control words Mcint($T_p$), corresponding to the intermediate control states to be added between two consecutive digital control states corresponding to the control words Mc($T_{p-1}$) and Mc($T_{p+1}$) memorized and stored in the tables of the memory 22, the control words Mc($T_{p-1}$) and Mc($T_{p+1}$) being respectively associated with two stored temperature values immediately below $T_{p-1}$ and immediately above $T_{p+1}$ the measured intermediate temperature $T_{pint}$. For this, each intermediate control word is computed by the control device 20, by interpolation, or by extrapolation, from stored control words Mc($T_{p-1}$) and Mc($T_{p+1}$). Any type of interpolation, or extrapolation, can be used, such as, for example, a linear interpolation or a more complex interpolation of nonlinear type.

For example, according to this embodiment, the stored control words can be coded on n bits and the control words computed and applied at the input of the DAC 23 can be coded on m bits, with m>n. For example, the stored temperature words can be coded on i bits and the temperature words computed in the control device 20 can be coded on j bits, with j>i.

Mcint($T_{pint}$) is the intermediate control word of m bits computed by interpolation/extrapolation for the measured intermediate temperature word $T_{pint}$ coded on j bits.

The interpolation/extrapolation then consists in computing Mcint($T_p$) as a function of the known variables Mc($T_{p-1}$), Mc($T_{p+1}$), $T_{pint}$, $T_{p-1}$, $T_{p+1}$. One possible computation method can consist, for example, in using a linear interpolation, but other types of interpolation can also be used. In the case of the use of a linear interpolation, Mcint($T_{pint}$) can be computed as follows:

$$Mcint(T_{pint})=2^{m-n} \times [Mc(T_{p-1})+(((Mc(T_{p+1})-Mc(T_{p-1})) \times (T_{pint}-T_{p-1})/(T_{p+1}-T_{p-1}))]$$

Figure 6B:
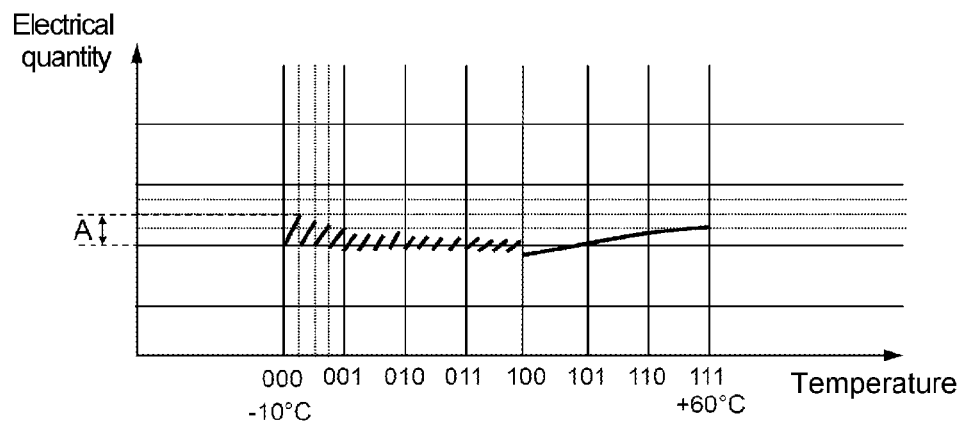
Figure 6C:
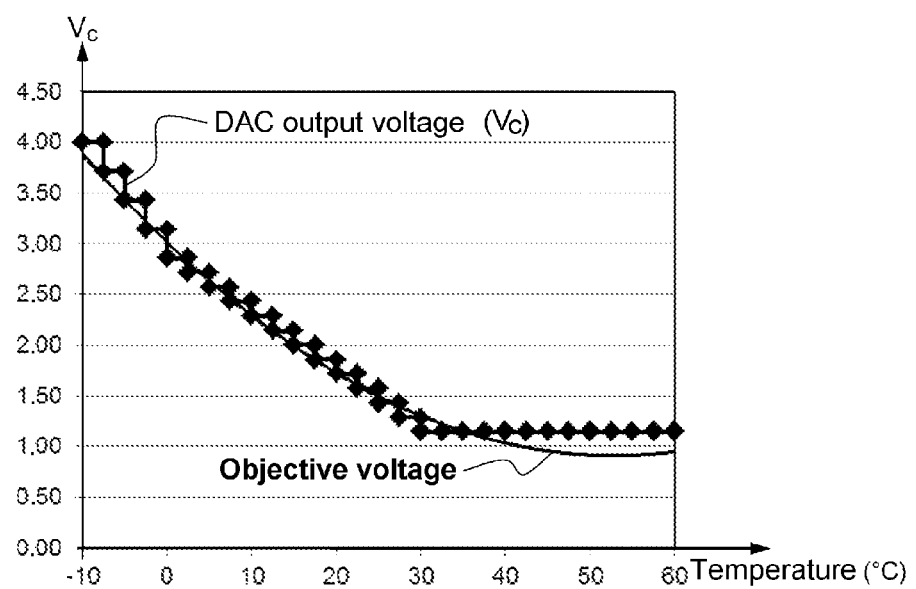

FIGS. 6a, 6b, 6c illustrate an example conforming to this third embodiment of the invention, in which i=3 and j=i+2=5 and n=3 and m=n+2=5. By applying the computation formula indicated above to the example of FIG. 3b, the table of FIG. 6a is obtained. For example:

$$Mcint(00001)=2^2 \times [7+((5-7) \times (1-0)/(4-0))]=26$$

$$Mcint(01111)=2^2 \times [3+((2-3) \times (15-12)/(16-12))]=9$$

By adding, by linear interpolation, a number of intermediate states between the different stored temperature states and also between the different stored control states, which consists in interpolating over a number of control bits greater than the stored number of control bits, it is thus possible to more finely compensate the gain of the equipment item as a function of temperature and to reduce the amplitude of variation of the gain of the equipment item on each change of digital temperature state as the example of FIG. 6b shows. FIG. 6c represents a typical curve of corresponding variation of control voltage as a function of temperature. The comparison of FIGS. 6b, 4c and 3c shows the advantage provided by this third embodiment of the invention which makes it possible to obtain smaller gain variations and therefore reduce the amplitudes A of the transient signals without in any way having increased the space of the memory 22.

Figure 7A:
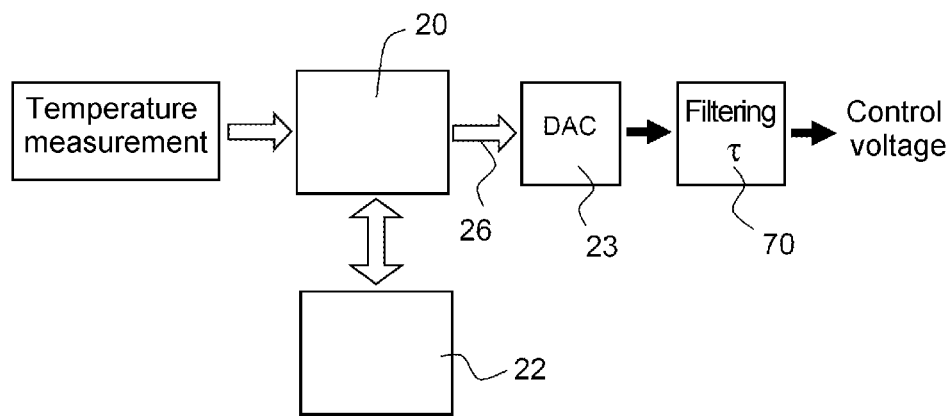
FIG. 7a: a block diagram of an example of a device for digitally compensating variations of the gain of a radiofrequency telecommunications equipment item as a function of temperature comprising a filtering device, according to another embodiment of the invention.
Figure 7B:
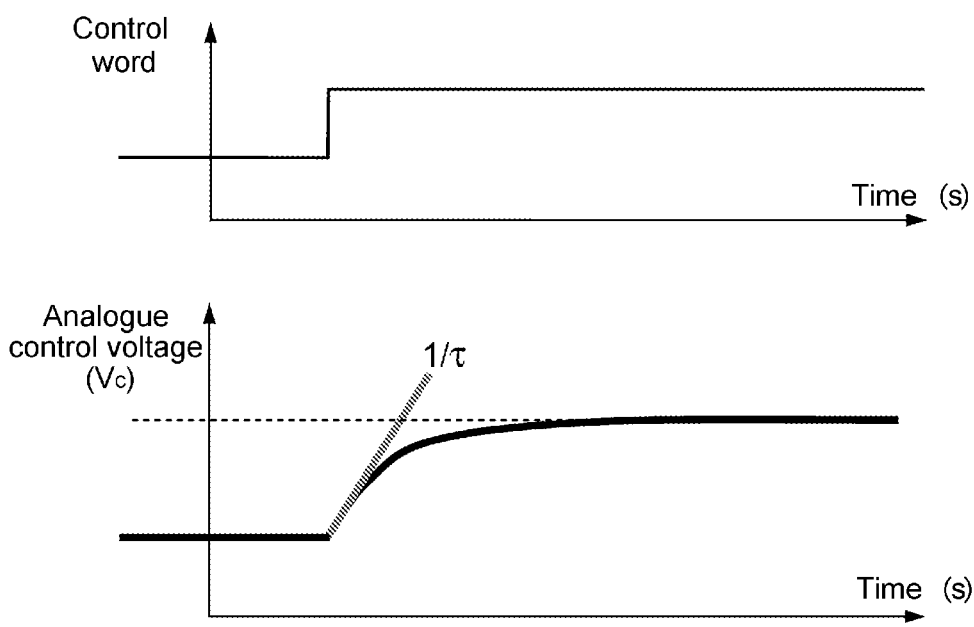

Finally, the invention can comprise a step consisting, at the output of the digital/analogue convertor 23, in introducing an analogue linear temporal filtering device 70 having a time constant τ, which filters, in a ratio 1/τ, the control voltage Vc delivered by the digital/analogue convertor, as represented in the examples of FIGS. 7a and 7b. The filtering device 70, of low-pass type, makes it possible, on each change of state, to smooth the variation of the analogue control voltage Vc which results therefrom and to limit and slow down the spurious fluctuations of amplitude and of phase to the level of the gain of the equipment item so that they are negligible over the duration of a data bit of the telecommunications signals. The value of the time constant $\tau$ of the filtering results from a compromise. The time constant $\tau$ is in fact optimized to be, on the one hand, long enough to ensure the harmlessness of the spurious transient fluctuations relative to the telecommunications signals and avoid any risk of traffic interruption in case of digital gain compensation and also in case of change of gain by remote control, and, on the other hand, short enough to be able to be implemented easily and not strain the use of the equipment item in tests or in its operational working. The time constant $\tau$ depends on the type of modulation used for the communication data transmission but is determined in such a way that the phase of the spurious fluctuations turns by a negligible angle during the duration of a bit or of a symbol. Optimally, the filtering can be dimensioned to have a negligible phase variation when the telecommunications bit rate is very slow, for example less than or equal to 64 Kbits/second, which corresponds for example to the case of a robust modulation of QPSK or BPSK type that is highly insensitive to the phase variations. The filtering can also be dimensioned for cases of more effective modulation of 8PSK and above type, which are more sensitive to the phase variations, but for which the bit rate of the data is currently of the order of 8 Mbits/second minimum. As a nonlimiting example, for a modulation of BPSK type in which a symbol corresponds to a bit, a spurious phase variation of less than 0.1° over a symbol, for a bit rate of 6 Kbits/second which corresponds to a period of 170 μs, and a transient signal of 5°, a time constant $\tau$ equal to 8 ms is typically needed. The filtering device can be used alone or in combination with the first and/or the second and the third embodiments of the invention.

Although the invention has been described in conjunction with particular embodiments, it is obvious that it is in no way limited thereto and that it includes all the technical equivalents of the means described and their combinations provided that the latter fall within the framework of the invention.

The invention claimed is:

1. A method for digitally compensating variations, as a function of temperature, of an electrical quantity of an embedded space radiofrequency telecommunications equipment item, the equipment item comprising N individual devices, where N is greater than or equal to one, the electrical quantity of the equipment item having to be maintained at a predetermined setpoint value, the method comprising, in order:

measuring the temperature of the equipment item at different measurement instants, at each measurement instant, in interrogating look-up tables, respectively dedicated to different setpoint values, in which digital control words are stored that are to be applied to the equipment item as a function of different digital temperature states corresponding to different measured temperature values, when the measured temperature is situated between two digital temperature states stored in the look-up tables, in creating intermediate digital temperature states situated between the two stored digital temperature states and in computing, by interpolation, digital control words corresponding to the intermediate digital temperature states created, creating, by interpolation between two stored digital control words, intermediate digital control words coded on a number of bits greater than the number of bits of the stored digital control words, selecting a digital control word corresponding to the measured temperature, and delivering, to the equipment item, an analogue control corresponding to the selected digital control word.

2. The method according to claim 1, in which, when N is greater than one, on each change of digital temperature state, the analogue control corresponding to the selected digital control word is delivered to just one of the N individual devices of the equipment item, the N individual devices being chosen sequentially in turn on each change of digital temperature state.

3. The method according to claim 1, in which, on each change of digital temperature state, the analogue control corresponding to the selected digital control word is divided up into N individual analogue controls respectively delivered to the N individual devices of the equipment item, the N individual analogue controls being staggered in time relative to one another.

4. The method according to claim 1, further comprising applying a linear temporal filtering to the analogue control.

* * * * *